(12) United States Patent
Meisinger et al.

(10) Patent No.: US 11,329,479 B2
(45) Date of Patent: May 10, 2022

(54) LOCATING AND ISOLATING GRID FAULTS UTILIZING A FAST CLOSE-OPEN OPERATION

(71) Applicant: S&C Electric Company, Chicago, IL (US)

(72) Inventors: Michael Meisinger, Chicago, IL (US); Martin Bishop, Oak Creek, WI (US); Stephen Williams, Caledonia, WI (US); David Porter, East Troy, WI (US)

(73) Assignee: S&C Electric Company, Chicago, IL (US)

(*) Notice: Subject to any disclaimer, the term of this patent is extended or adjusted under 35 U.S.C. 154(b) by 142 days.

(21) Appl. No.: 17/017,036

(22) Filed: Sep. 10, 2020

(65) Prior Publication Data

US 2021/0091557 A1 Mar. 25, 2021

Related U.S. Application Data

(60) Provisional application No. 62/902,581, filed on Sep. 19, 2019.

(51) Int. Cl.
*H02H 7/26* (2006.01)
*H02H 7/22* (2006.01)
(Continued)

(52) U.S. Cl.
CPC ............ *H02H 7/22* (2013.01); *G01R 31/086* (2013.01); *H02H 3/003* (2013.01); *H02H 3/021* (2013.01);
(Continued)

(58) Field of Classification Search
CPC ............ H02H 7/26; H02H 7/22; H02H 3/021; H02H 3/06; H02H 3/08; H02H 3/38; H02H 3/003; G01R 31/086
See application file for complete search history.

(56) References Cited

U.S. PATENT DOCUMENTS 2,573,459 A * 10/1951 Lincks ............... H01H 75/04
361/109
4,644,438 A * 2/1987 Puccinelli ............. H02H 3/07
361/75

(Continued)

OTHER PUBLICATIONS

Lee, Yonghee; Meliopoulos, A.m Lee, Ju-uk; New Feeder Automation Scheme using VIT Reclosers and VIT Sectionalizers; Nov. 4, 2013, IEEE, Grenoble Conference, 6 pages. (Year: 2013).*

(Continued)

*Primary Examiner* — Harry R Behm

(57) ABSTRACT

A control system and method for sectionalizing switches and pulse-testing interrupter/reclosers in a distribution grid feeder which enables fault location, isolation and service restoration without requiring an external communications infrastructure to pass information between the switches. The method includes switches entering an armed state when they experience a high fault current during an initial fault event. Then, when the interrupter/recloser runs its test pulse sequence, any armed switch counts all test pulses as fault pulses, while non-armed switches count the test pulses as load pulses. Switches open to isolate the fault based on threshold values of fault pulse count and load pulse count. When an initially active interrupter/recloser completes its test pulse sequence, another interrupter/recloser begins its sequence, and all switches reconfigure their threshold values based on the new interrupter/recloser. Interrupter/reclosers after the initial device use a fast close-open event if necessary to arm some switches for proper fault-count opening.

20 Claims, 7 Drawing Sheets

(51) Int. Cl.
*G01R 31/08* (2020.01)
*H02H 3/08* (2006.01)
*H02H 3/00* (2006.01)
*H02H 3/02* (2006.01)
*H02H 3/06* (2006.01)
*H02H 3/38* (2006.01)

(52) U.S. Cl.
CPC ............... *H02H 3/06* (2013.01); *H02H 3/08* (2013.01); *H02H 3/38* (2013.01); *H02H 7/26* (2013.01)

(56) References Cited

U.S. PATENT DOCUMENTS

| | | | | |
|---|---|---|---|---|
| 4,758,919 A | * | 7/1988 | Stewart | H02H 3/06 361/114 |
| 5,097,380 A | * | 3/1992 | Moran | H02H 3/063 361/113 |
| 6,018,449 A | | 1/2000 | Nelson et al. | |
| 8,538,708 B2 | | 9/2013 | Yadav et al. | |
| 2008/0024142 A1 | * | 1/2008 | Opfer | H01H 75/04 324/555 |
| 2010/0296215 A1 | * | 11/2010 | Montenegro | H01H 75/04 361/59 |
| 2013/0069437 A1 | | 3/2013 | Biallas et al. | |
| 2014/0277804 A1 | * | 9/2014 | Witte | H02H 3/06 700/293 |
| 2020/0119546 A1 | | 4/2020 | Quinlan | |

OTHER PUBLICATIONS

International Search Report and Written Opinion for International Application No. PCT/US2020/050143 dated Nov. 30, 2020. (7 pages).

* cited by examiner

LOCATING AND ISOLATING GRID FAULTS UTILIZING A FAST CLOSE-OPEN OPERATION

BACKGROUND

Field

The present disclosure relates generally to a control scheme for sectionalizing switches in an electrical grid feeder. More particularly, it relates to a system and method enabling automated sectionalizing switches equipped with only three-phase current sensing to isolate faults when upstream interrupter/reclosers are testing for continued fault presence.

Discussion of the Related Art

An electrical power transmission/distribution network, often referred to as an electrical grid, typically includes a number of power generation plants each including a number of power generator units, such as gas turbine engines, nuclear reactors, coal-fired generators, hydro-electric dams, etc. The grid may also include wind and/or solar energy generation farms. Not only are there many different types of energy generators on the grid, but there are many different types of loads, and the generators and loads are distributed over large geographic areas. The transmission grid carries electricity from the power plants over long distances at high voltages. The distribution grid, separated from the transmission grid by voltage-reducing transformers in a variety of substations, provides electricity to the consumers/loads.

Many portions of the distribution grid, commonly known as feeders, are arranged between two or more different sources (i.e., substations, or adjacent feeders), where one source is a main or primary source which is normally connected to and provides the preferred source of power to the feeder, and the other sources are alternates which are normally disconnected from the feeder by an open switching device. Additional switches, known as sectionalizing switches, are also typically placed along the length of a feeder, thereby creating multiple feeder sections each separated by a switch, where each feeder section typically serves multiple customers. If a fault occurs in the feeder, the fault can be isolated by opening one or more of the normally-closed sectionalizing switches.

Control of the sectionalizing switches has been largely automated in recent years, using a strategy known as fault location, isolation and service restoration (FLISR). FLISR applications can reduce the number of customers impacted by a fault by automatically isolating the trouble area and restoring service to remaining customers by transferring them to adjacent circuits. In addition, the fault isolation feature of the technology can help crews locate the trouble spots more quickly, resulting in shorter outage durations for the customers impacted by the faulted section.

One known FLISR technique is a centralized FLISR system, where real-time communications between switches and a controller are required to locate and isolate a fault in a feeder. Centralized FLISR systems, based on real-time communications, are effective when the communication channels are operable, but are completely defeated when communication is interrupted for any reason. The communication system equipment requirements also add cost and complexity to the switches. Another known FLISR technique involves pre-defined, static behavior characteristics for each sectionalizing switch. In this approach, each switch is pre-programmed to open if it experiences a certain number of fault current or voltage events, where the pre-programmed number is based on each switch's proximity to the feeder source. However, if the feeder source changes to an alternate, the pre-programmed sectionalizing switch behavior will result in incomplete or suboptimal fault isolation.

Pulse-testing interrupter/reclosers are known in the industry, where these interrupter/reclosers operate as a smart source interrupter which, after a fault is initially detected, deliver a series of test pulses to the feeder. The low energy test pulses are designed to detect the continued presence of a fault, and are recognized by the sectionalizing switches as fault current events or load current events, where the sectionalizing switches open if they experience a number of events exceeding a threshold. However, it can be difficult in some situations for a sectionalizing switch to distinguish between a fault current pulse and a load current pulse during the testing process.

In view of the circumstances described above, there is need for a sectionalizing switch control methodology which does not rely on an additional real-time communications infrastructure between switches and controllers in distribution grid feeders, yet controls switch opening behavior properly to isolate faults while still accruing the benefits of using low-energy test pulses.

SUMMARY

The present disclosure describes a control system and method for sectionalizing switches and pulse-testing interrupter/reclosers in a feeder, or portion of the distribution grid, which enables fault location, isolation and service restoration without requiring a separate communications infrastructure between the switches and/or a central controller. The method includes switches entering an armed state when they experience a high fault current during an initial fault event. Then, when the interrupter/recloser runs its test pulse sequence, any armed switch counts all test pulses as fault pulse events, while non-armed switches count the test pulses as load pulse events. Switches open to isolate the fault based on threshold values of fault count and load count events. When an initially active interrupter/recloser completes its test pulse sequence, another interrupter/recloser may begin its sequence, and all switches reconfigure their threshold values based on the new interrupter/recloser. After the interrupter/recloser has completed its test pulse sequence other related interrupter/reclosers use a fast close-open event if necessary to arm remaining switches for proper fault-count opening.

Additional features of the present disclosure will become apparent from the following description and appended claims, taken in conjunction with the accompanying drawings.

DETAILED DESCRIPTION OF THE EMBODIMENTS

The following discussion of the embodiments of the disclosure directed to a technique for isolating a fault in a feeder using sectionalizing switches, including arming switches and fast close-open events, is merely exemplary in nature, and is in no way intended to limit the disclosure or its applications or uses.

An electrical power grid consists of a transmission network and a distribution network. The transmission network handles the movement of high-voltage electrical energy from a generating site, such as a power plant, to an electrical substation. The distribution network moves medium-voltage electrical energy on local wiring between substations and customers. Because the distribution portion of the grid includes power lines which are exposed to many fault-inducing conditions including wind, lightning, ice and snow, contamination, tree contacts, pole damage from vehicle collisions, etc., faults occur on the distribution grid. Fault location, isolation and service restoration (FLISR) is the name given to a set of techniques applied by many electric utilities to recover from faults on the distribution grid.

Figure 1:
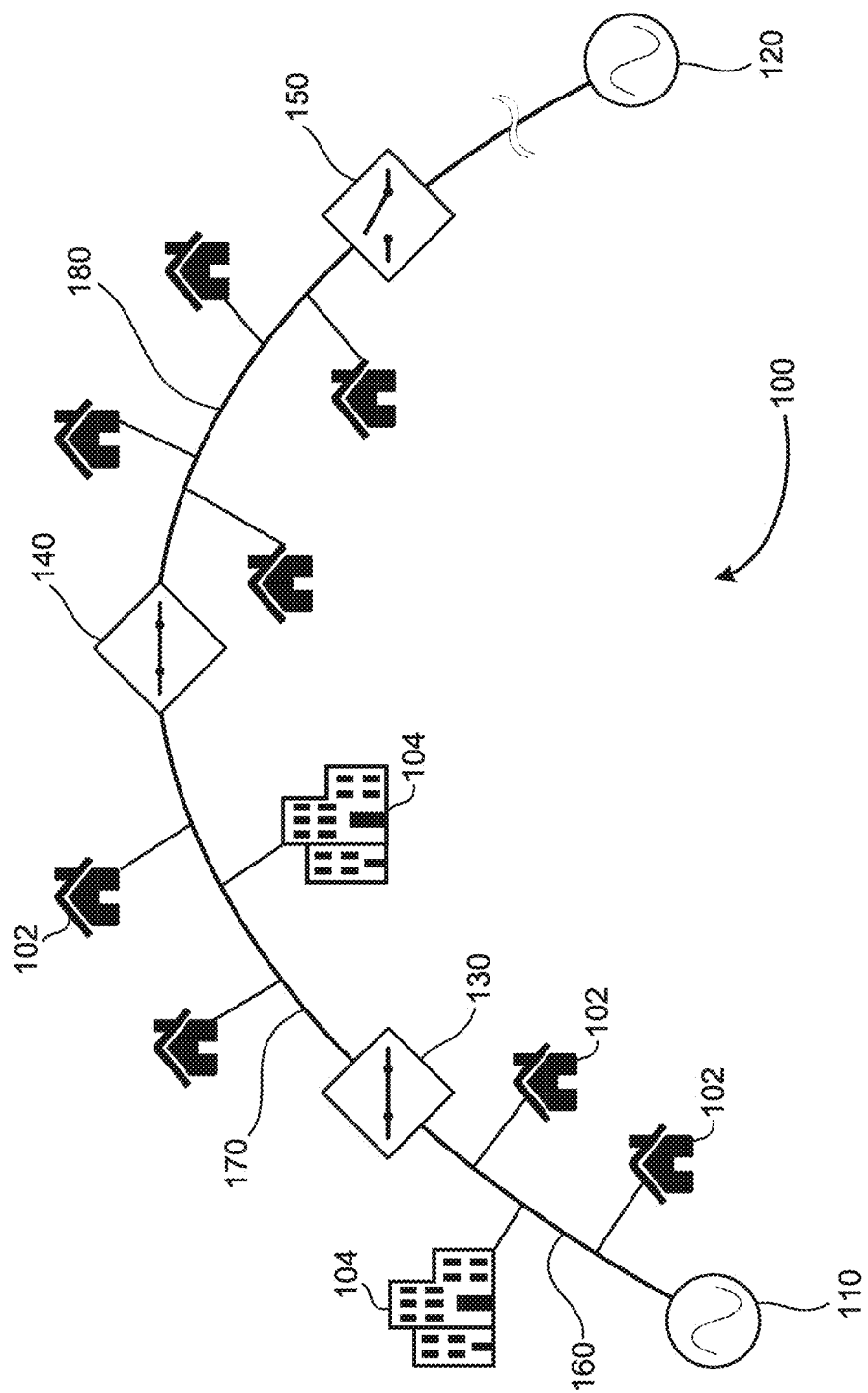
FIG. 1 is a simplified schematic diagram of a typical distribution system feeder, or portion of the distribution grid, as known in the art.

FIG. 1 is a simplified schematic diagram of a typical feeder 100, or portion of the distribution grid, as known in the art. The feeder 100 provides electrical energy to many end customers, including houses 102 and businesses 104. The feeder 100 has a main source 110 at one end and an alternate source 120 at the other end. The sources 110 and 120 are typically substations, that include a fault interrupting device at the connection of each feeder to the substation electrical bus (interrupting device and electrical bus not shown), where high voltage energy (60,000 volts line to line or greater) on the transmission grid is transformed down to medium voltage energy (often 38,000 volts line to line or less). The main source 110 is normally connected to and provides the power to the feeder 100, while the alternate source 120 is normally disconnected from the feeder 100 by a device such as a switch or a device that has fault interrupting capability. While the following discussion focuses around three (3) phase feeder configuration, this discussion is meant to be exemplary and not limiting to other configurations, such as single phase configurations.

Between the main source 110 and the alternate source 120, switches 130, 140 and 150 divide the feeder 100 into sections. A section 160 is located between the main source 110 and the switch 130, a section 170 is located between the switch 130 and the switch 140, and a section 180 is located between the switch 140 and the switch 150. The switches 130 and 140 are normally closed, so that the main source 110 provides power to the sections 160, 170 and 180 of the feeder 100. The switch 150 is normally open, so that the alternate source 120 is normally not connected to the feeder 100. In fact, there is typically another feeder between the alternate source 120 and the switch 150, where the switch 150 forms the boundary or tie point between the feeder 100 and the adjacent feeder. The switches 130 and 140, which separate the sections 160, 170 and 180, are known as sectionalizing switches.

It is to be understood that the feeder 100 is a three-phase network. That is, each of the sections 160, 170 and 180 includes three conductors (Phase A, Phase B and Phase C), each electrically 120° from the others. The houses 102 and the businesses 104 may receive service from one or more of the phases, where the houses 102 almost always have single-phase service, and the businesses 104 may have three-phase service if they have high energy demands and/or large loads. The feeder 100 illustrated in FIG. 1 is very simple, not including branches as would be found in practical implementations. The feeder 100 is merely shown and discussed here as a way of introducing general feeder terminology and describing the basic function of sectionalizing switches.

If a fault occurs in the feeder 100, such as a lightning strike which causes an insulation flashover of one or more power lines in the section 180 causing a line-to-line or line-to-ground fault, it is possible to isolate the fault and restore power to the sections 160 and 170 by opening the switch 140. This fault isolation and service restoration could be performed by line service crews visually locating the fault and manually opening the switch. A preferred alternative is the use of FLISR techniques, where fault isolation and service restoration occurs automatically and faster than manual methods.

However, traditional centralized FLISR techniques require real-time communication between the switches 130/140/150 and a common controller, so that voltage and current measurements at each device, along with device open/closed status, can be used to command and control the status of other adjacent devices. These real-time communication-based FLISR techniques work well as long as the communication channels are operable, but are completely defeated if the communication channels become inoperable. Even with modern technology, any communication medium can experience an outage—whether due to equipment failure, infrastructure damage, wireless signal interference or jamming, computer malware, or otherwise. In addition, the requirement for communications capability in the sectionalizing switches increases the cost and complexity of the switches. For these reasons, a new FLISR technique is needed which does not require an additional real-time communication system infrastructure and can rely on the capability of a low energy pulse testing system.

Figure 2A:
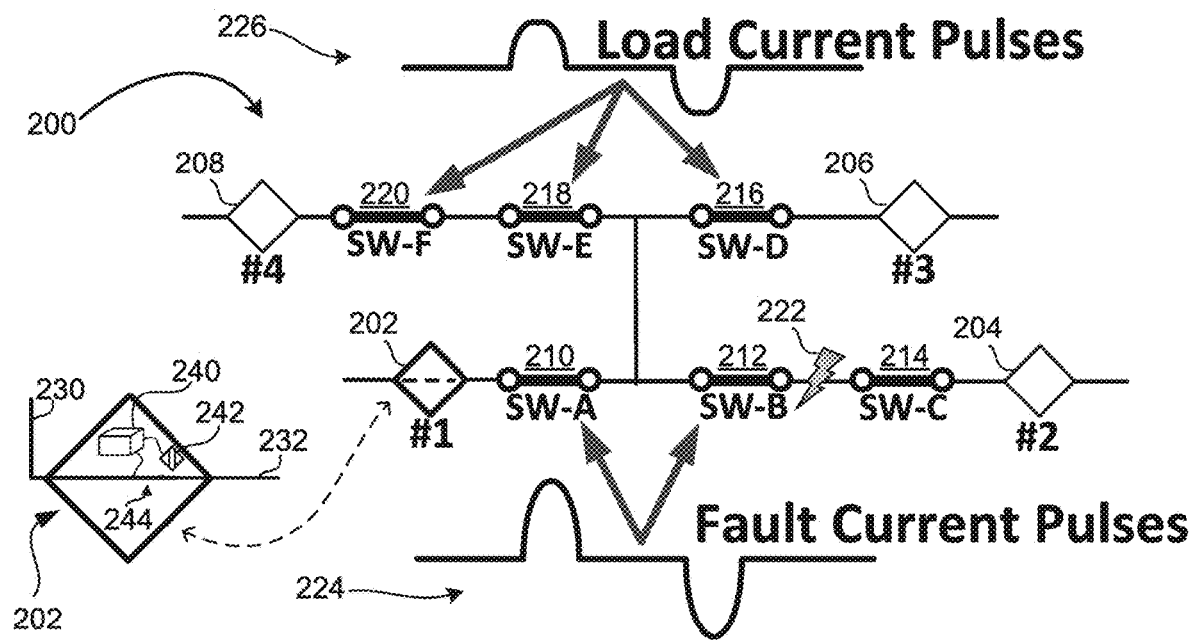
FIG. 2A is a schematic diagram of a feeder illustrating an idealized current sensing by sectionalizing switches using known techniques for detecting test pulses from an interrupter/recloser.

FIG. 2A is a schematic diagram of a feeder 200 illustrating idealized current sensing by sectionalizing switches using known techniques for detecting test pulses from an interrupter/recloser. The feeder 200 includes two branch points and four different sources, any one of which may be powering the feeder 200 at a particular time. The feeder 200 also includes a plurality of sectionalizing switches, as discussed above. Loads (homes and businesses) are not shown in FIG. 2 for the sake of simplicity and clarity.

An interrupter/recloser 202 serves as an initial energy source for the feeder 200 and includes fault detection, switch opening, and reclosing or pulse-testing capability which will be discussed further below. A block diagram of the main elements of the interrupter/recloser 202 is shown at the bottom left of FIG. 2A. The interrupter/recloser 202 receives medium-voltage power (alternating current, or AC) from the distribution grid on line 230 and provides power to the feeder 200 on line 232 in this normal circuit configuration. Again, both the lines 230 and 232 are three phases, represented here by a single line for simplicity. A controller 240 is connected to a plurality of sensors 242 and fault interrupting switching devices 244. The controller 240 includes a processor and memory capable of storing data and programming instructions for controlling the operation of the interrupter/recloser 202. The sensors 242 include at least a current sensor and a voltage sensor on each of the three phases, where the sensors 242 are capable of detecting conditions such as low voltage or excess current. Such conditions indicate the presence of a fault somewhere in the feeder 200 on one or more of the phases.

Based on data from the sensors 242, the controller 240 may determine that it is necessary to open the fault interrupter switches 244 for one phase or all three phases of power. Each of the switches 244 has only one pole corresponding to one phase of power, but as normally configured by electric utility companies, all three poles/phases are opened by the interrupter/recloser 202 when a fault is detected on any one or more of the phases, to completely de-energize the feeder 200. The controller 240 in the interrupter/recloser 202 also contains control logic for selectively reclosing the switches 244 in attempts to re-energize part of the feeder 200. The interrupter/recloser 202 performs a pulse test sequence in an attempt to cause the sectionalizing switches to open to isolate the faulted feeder section. This sectionalizing switch and interrupter/recloser operation is discussed further below.

An interrupter/recloser 204 is located at the right end on a lower branch of the feeder 200, an interrupter/recloser 206 is located at the right end on an upper branch of the feeder 200, and an interrupter/recloser 208 is located at the left end on an upper branch of the feeder 200. The interrupter/reclosers 204, 206 and 208 are of the same design as the interrupter/recloser 202, having the sensors 242, the fault interrupting switches 244 and the controller 240, and including pulse testing capability. The interrupter/recloser 202, being the main source to the feeder 200, may be directly adjacent to a substation, while the interrupter/reclosers 204, 206 and 208, being alternate sources, may be tie point boundaries to adjacent feeders. In FIG. 2A, the interrupter/recloser 202 is in pulse-test mode, as indicated by its medium-weight outline with a dashed horizontal pulse line. The interrupter/reclosers 204, 206 and 208 are in an open state, meaning they are not supplying power to the feeder 200 in FIG. 2A, as indicated by their thin outline and lack of any horizontal line. The interrupter/reclosers 202, 204, 206 and 208 are numbered 1-4 as an indication of the order in which they are configured to perform their test-pulse sequences in the following discussion.

The feeder 200 includes a sectionalizing switch 210 (Switch A or "SW-A" for simplicity), a sectionalizing switch 212 ("SW-B"), a sectionalizing switch 214 ("SW-C"), a sectionalizing switch 216 ("SW-D"), a sectionalizing switch 218 ("SW-E"), and a sectionalizing switch 220 ("SW-F"). The sectionalizing switches 210-220 are all normally-closed, providing connectivity from the active source (the interrupter/recloser 202) to the loads connected to the entire feeder 200 (loads not shown on the diagram). In the known distributed FLISR technique of FIG. 2, the sectionalizing switches may or may not have additional communications system hardware to use an external communications system infrastructure, but communication is not used for automated fault sectionalizing purposes. Instead, each of the sectionalizing switches 210-220 includes current sensors and a controller capable of opening the switch to isolate a fault.

The controller in each of the sectionalizing switches 210-220 is configured with pre-defined logic which determines under what conditions the particular switch will open. The pre-defined logic, designed to isolate a fault in the feeder 200 without opening more switches than necessary to isolate the fault, is based on each switch's proximity to the active feeder source. When the sectionalizing switches include only current sensors (no voltage sensors) as in the feeder 200 of FIG. 2, the switches are configured to detect fault-pulse currents and load-pulse currents during the pulse-test sequence of the interrupter/reclosers, and each switch will open if it reaches its threshold value for either fault pulse counts or load pulse counts.

The sectionalizing switches 210-220 each have a threshold value for FC (fault pulse counts) and a value for LC (load pulse counts). The FC threshold represents the number of fault current pulse events that a switch must count during an interrupter/recloser pulse sequence for the switch control to command the switch to open. The LC threshold represents the number of load current pulse events that a switch must count during an interrupter/recloser pulse sequence for the switch control to command the switch to open. Fault currents are relatively high currents because the current is flowing from the source to a fault such as a short circuit, while load currents are relatively lower currents flowing from the source to whatever loads are connected to the circuit downstream of a switch. The pre-defined logic in the sectionalizing switches 210-220 dictates that switches nearest the active source have the lowest LC threshold and the highest FC threshold, while switches furthest from the active source have the highest LC threshold and the lowest FC threshold. For example, SW-A (210) is nearest the active interrupter/recloser 202, and therefore has threshold values of FC=3 and LC=1. Conversely, SW-C (214) is furthest from the active interrupter/recloser 202, and therefore has threshold values of FC=1 and LC=3.

The pre-defined values of FC and LC threshold are designed to cause the desired switch opening behavior in the event of a fault in a feeder section, as long as each switch can distinguish between fault current pulses and load current pulses. For example, in the event of a fault 222 in the lower right branch between the sectionalizing switches 212 and 214, the desired response is for the switches 212 and 214 to open, thereby fully isolating the faulted feeder section. After the fault 222 is initially detected, the interrupter/recloser 202 will enter a pulse testing mode, where the device creates a sequence of current pulses through the feeder 200. The pulses provided by the interrupter/recloser 202 are low energy partial-reclosing events, as it is undesirable to repeatedly send high energy full-reclosing fault currents through portions of the feeder 200.

Ideally, the sectionalizing switches 210-220 can distinguish between fault current pulses 224 (larger current pulses indicating that a switch is located between the active interrupter/recloser and the fault location) and load current pulses 226. In FIG. 2A, the switches 210 and 212 experience the fault current pulses 224, while the switches 216, 218 and 220 (which are not in the feeder path between the pulse testing device and the fault 222) experience the load current pulses 226. The switch 214 could experience load current pulses on unfaulted phases, but will not experience fault current pulses.

If the interrupter/reclosers were performing a full reclosing duty cycle, with the associated high energy fault current due to the fault, the sectionalizing switches would have a larger current difference in most applications to distinguish fault currents from load currents. However, in practical conditions where the interrupter/reclosers are sending low energy test pulses (which have many advantages over a high energy reclosing current), the current sensors and controller in the sectionalizing switches are challenged with differentiating pulse current signals produced by a fault condition (fault-pulses) from current signals associated with a load condition (load-pulses).

Figure 2B:
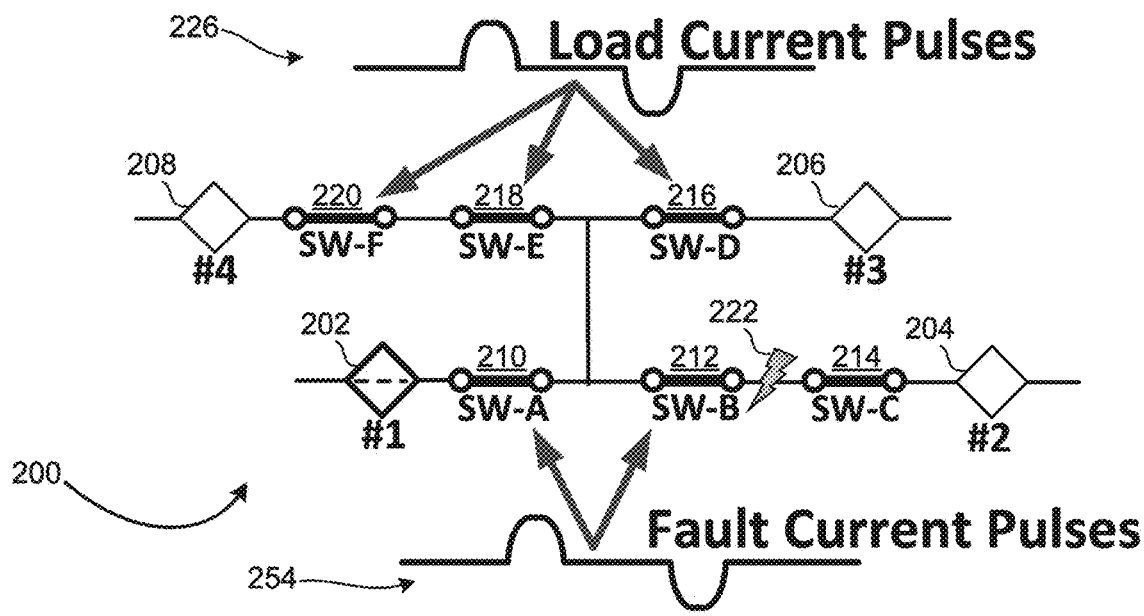
FIG. 2B is a schematic diagram of a feeder illustrating a possible actual current sensing by sectionalizing switches using known techniques for detecting test pulses from an interrupter/recloser.

FIG. 2B is a schematic diagram of the feeder 200 illustrating a possible actual current sensing by sectionalizing switches using known techniques for detecting test pulses produced by an interrupter/recloser. As shown in FIG. 2B, it is possible that fault current pulses 254 sensed by the switches 210 and 212 are indistinguishable from the load current pulses 226 sensed by the switches 216, 218 and 220. This is particularly true if the switches 216, 218 and 220 have high customer load online at the time of the fault, such that their load current pulses are relatively high. In the scenario of FIG. 2B, where fault-current pulses are not properly identified by the switches between the pulse testing device and the fault location, the sectionalizing switches will not properly increment their FC and LC values during pulse-testing of the interrupter/recloser, and the proper switches will not open to isolate the fault.

This differentiation difficulty illustrated in FIG. 2B can be overcome by combining initial fault current sensing and subsequent pulse sensing information. For example, switch controls that sense the passage of the initial fault current would record this information. After observing a current of sufficient magnitude and duration to qualify as fault current, for a preconfigured period of time, a switch control would sense and interpret a subsequent sequential pulse and inverse pulse or just one of these pulses as a fault-pulse and accrue a fault-pulse count. Details of this methodology are discussed below.

Figure 3:
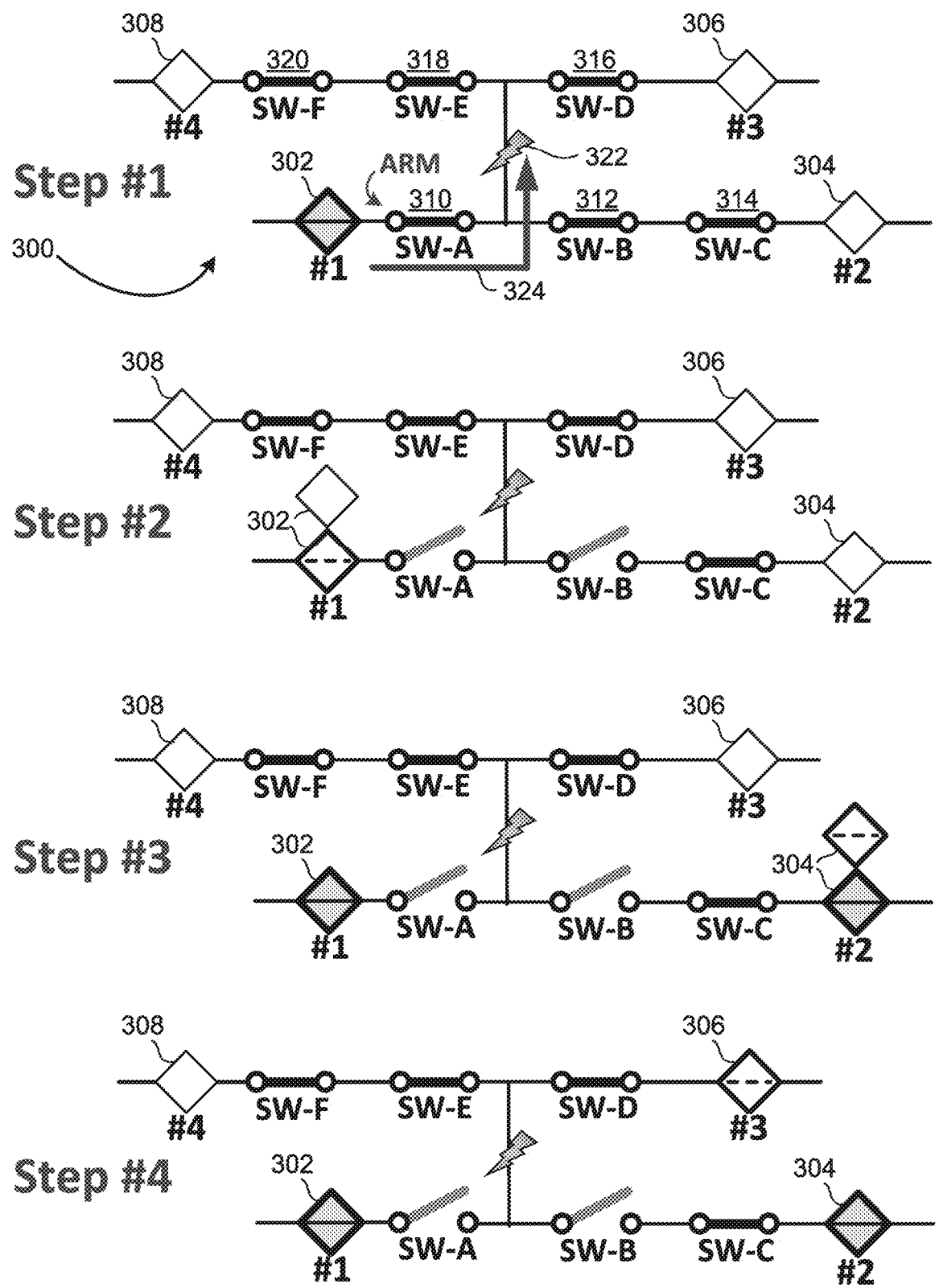
FIG. 3 is a multi-step schematic diagram of a feeder illustrating a response of sectionalizing switches to test pulses from an interrupter/recloser, where switches become armed in response to an initial fault current, according to an embodiment of the present disclosure.

FIG. 3 is a multi-step schematic diagram of a feeder 300 illustrating the response of sectionalizing switches to test pulses from an interrupter/recloser, where switches become armed in response to an initial fault current, according to an embodiment of the present disclosure. The feeder 300 has the same topology as the feeder 200 discussed previously, and the feeder 300 differs from the feeder 200 only in the programming logic configured in the controllers of the interrupter/reclosers and sectionalizing switches.

The feeder 300 includes interrupter/reclosers 302, 304, 306 and 308—numbered 1-4 respectively to indicate the order in which they will run their pulse-testing sequences. The feeder 300 also includes six sectionalizing switches—Switch-A (SW-A) 310, a Switch-B (SW-B) 312, a Switch-C(SW-C) 314, a Switch-D (SW-D) 316, a Switch-E (SW-E) 318, and a Switch-F (SW-F) 320. Reference numerals are shown only on Step #1 of FIG. 3, to reduce visual clutter.

The interrupter/recloser 302 is initially serving as the energy source for the feeder 300; that is, the interrupter/recloser 302 is closed in Step 1, as indicated by its heavy outline, solid switch line and fill shading. The interrupter/reclosers 304, 306 and 308 are all open at Step 1. The sectionalizing switches are all closed at Step 1.

At Step 1, a fault 322 occurs in the cross-branch located between the SW-A 310, SW-B 312, SW-D 316 and SW-E 318. When the fault 322 occurs, a fault current 324 passes through the SW-A 310 from the active source to the fault point along the feeder. The current sensors in the SW-A 310 detect the fault current 324, because the interrupter/recloser 302 is initially closed and the fault current 324 therefore has a high energy fault current magnitude. None of the other sectionalizing switches will experience the high energy fault current, as they are not located in the feeder path between the fault 322 and the interrupter/recloser 302.

According to embodiments of the present disclosure, when the SW-A 310 detects the fault current 324, the SW-A 310 enters an "armed" state. The armed state of the SW-A 310 means that the SW-A 310 control recognizes that it is located between the active source and the fault because it has experienced a high energy fault current event, and therefore subsequent test pulses sensed by the SW-A 310 within a defined time interval will be counted as fault pulses, even if the measured pulses are indistinguishable from load pulses. Conversely, switch controls that haven't sensed the passage of the high energy (initial) fault current would not be "armed" and would interpret subsequent pulses and inverse pulses within a defined time interval as load pulses (an unfaulted downstream condition due to loads on the circuit). Therefore, these switch controls would accrue a load-pulse count. Using a combination of fault-pulse and load-pulse counts accelerates fault isolation by opening switches after achieving a preconfigured number of counts.

At Step 2 of FIG. 3, the interrupter/recloser 302 first opens in response to detecting the fault 322, then after a brief time interval, begins its test pulse sequence. At the beginning of Step 2, the SW-A 310 is still closed. The interrupter/recloser 302 is shown twice at Step 2, with the open state over the pulsing state; this convention for two sequential states of an interrupter/recloser will be used again in FIGS. 3 and 4. The purpose of the pulse testing state of the interrupter/recloser is to determine if the fault is still present and, if so, use the pulse test waveforms and sensing logic in the sectionalizing switches to open to isolate (or at least partially isolate) the fault. The sectionalizing switches in the feeder 300 recognize that the interrupter/recloser 302 is active, and they therefore configure their FC and LC thresholds accordingly—with the SW-A 310 having thresholds of FC=3 and LC=1, the SW-B 312 having thresholds of FC=2 and LC=2, the SW-C 314 having thresholds of FC=1 and LC=3, etc.

When the interrupter/recloser 302 sends its first test pulse, the SW-A 310 (still closed) counts it as a fault current pulse, even if the pulse is indistinguishable from a load current pulse, because the SW-A 310 is in the armed state. The SW-B 312 (still closed) and the SW-C 314 each sense a load pulse and accrue this to their counts. The other sectionalizing switches may not sense any pulse from the interrupter/recloser 302 on the faulted phase because they are beyond (downstream of) the fault 322. When the interrupter/recloser 302 sends its second test pulse, the SW-A 310 counts it as its second fault current pulse, and the SW-B 312 and SW-C 314 count it as their second load current pulse. The SW-B 312 now has LC=2 which is its threshold for opening. Therefore, the SW-B 312 opens. The SW-C 314 does not sense any more test pulses from the interrupter/recloser 302 because the SW-B 312 is open. On the third test pulse from the interrupter/recloser 302, the SW-A 310 senses and counts its third fault current pulse, and the SW-A 310 opens on FC=3. This completes the pulse testing of the interrupter/recloser 302 and completes Step 2 of FIG. 3, with the SW-A 310 and the SW-B 312 open, isolating the fault 322 on the lower branch.

In Step 3, the interrupter/recloser 304 begins its test pulse sequence, determines that no fault is evident in its circuit (because the SW-B 312 is open), and immediately recloses (state=closed, as shown in the lower icon of the interrupter/recloser 304 in Step 3) to re-energize the feeder section between the interrupter/recloser 304 and the SW-B 312.

In Step 4 of FIG. 3, the interrupter/recloser 306 begins its test pulse sequence. None of the SW-D 316, the SW-E 318 or the SW-F 320 are armed, because these switches have not experienced an initial high energy fault current. Therefore, when the interrupter/recloser 306 sends its first test pulse, the SW-D 316 might interpret the pulse as a load pulse instead of a fault pulse, and the SW-D 316 would open on LC=1 (which is its threshold because it is closest to the interrupter/recloser 306). This is problematic because the SW-E 318 is not yet open to isolate the faulted segment. The interrupter/recloser 308 would then run its pulse testing sequence, which would lead to the opening of the SW-F 320 on LC=1. The opening of the SW-F 320 but not the SW-E 318 in this scenario is a sub-optimal system response. The problems illustrated in Step 4 (improper isolation by the switches in the top branches) stem from the inability to distinguish a load pulse from a fault pulse in this example of feeder and fault topology. These problems can be resolved by adding an operational step to the interrupter/reclosers which can be employed to arm sectionalizing switches other than the one(s) which experience the initial high energy fault current.

Figure 4A:
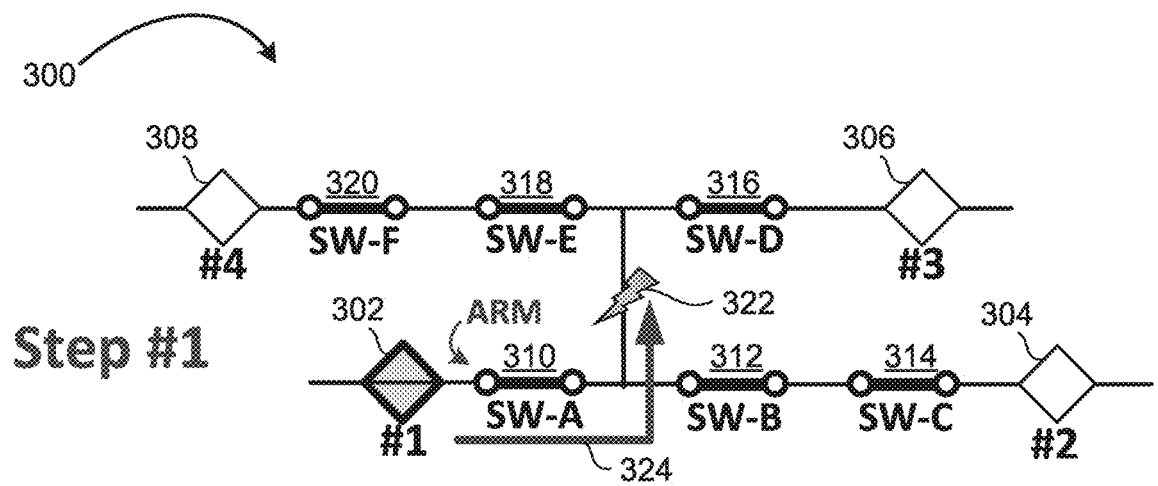
FIGS. 4A/4B/4C comprise a multi-step schematic diagram of a feeder illustrating a response of sectionalizing switches to test pulses from interrupter/reclosers, where the interrupter/reclosers use a fast close-open event to arm switches in an alternative source path, according to an embodiment of the present disclosure.
Figure 4A:
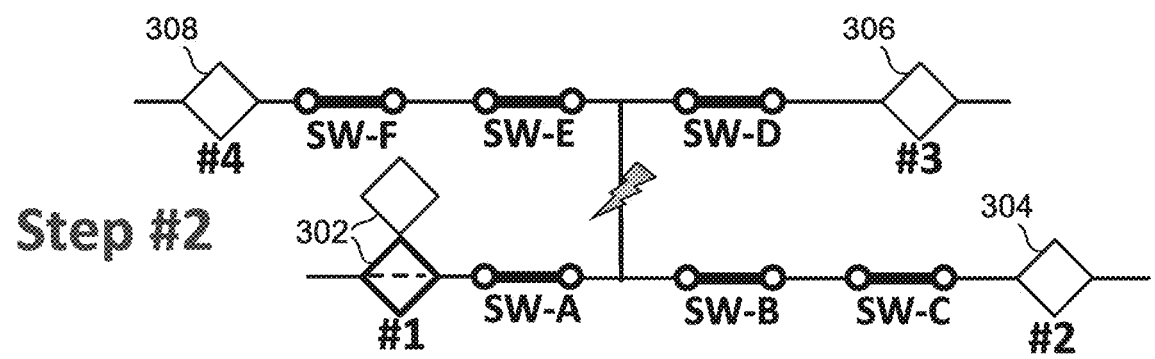
Figure 4A:
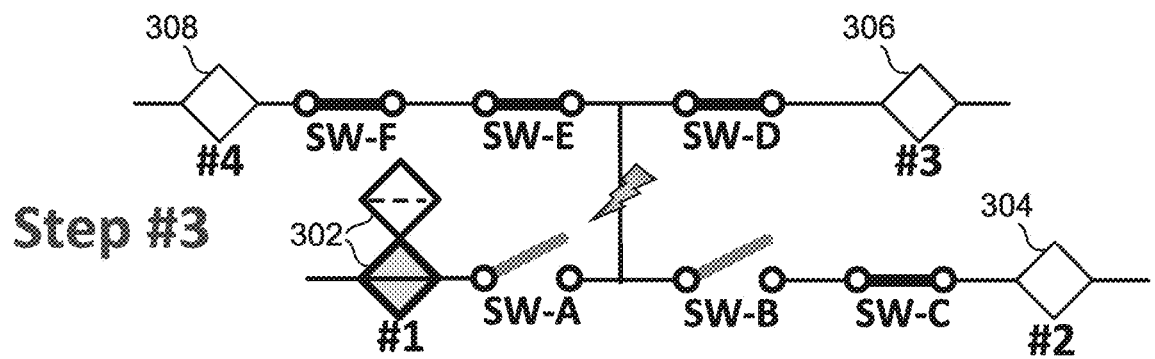
Figure 4B:
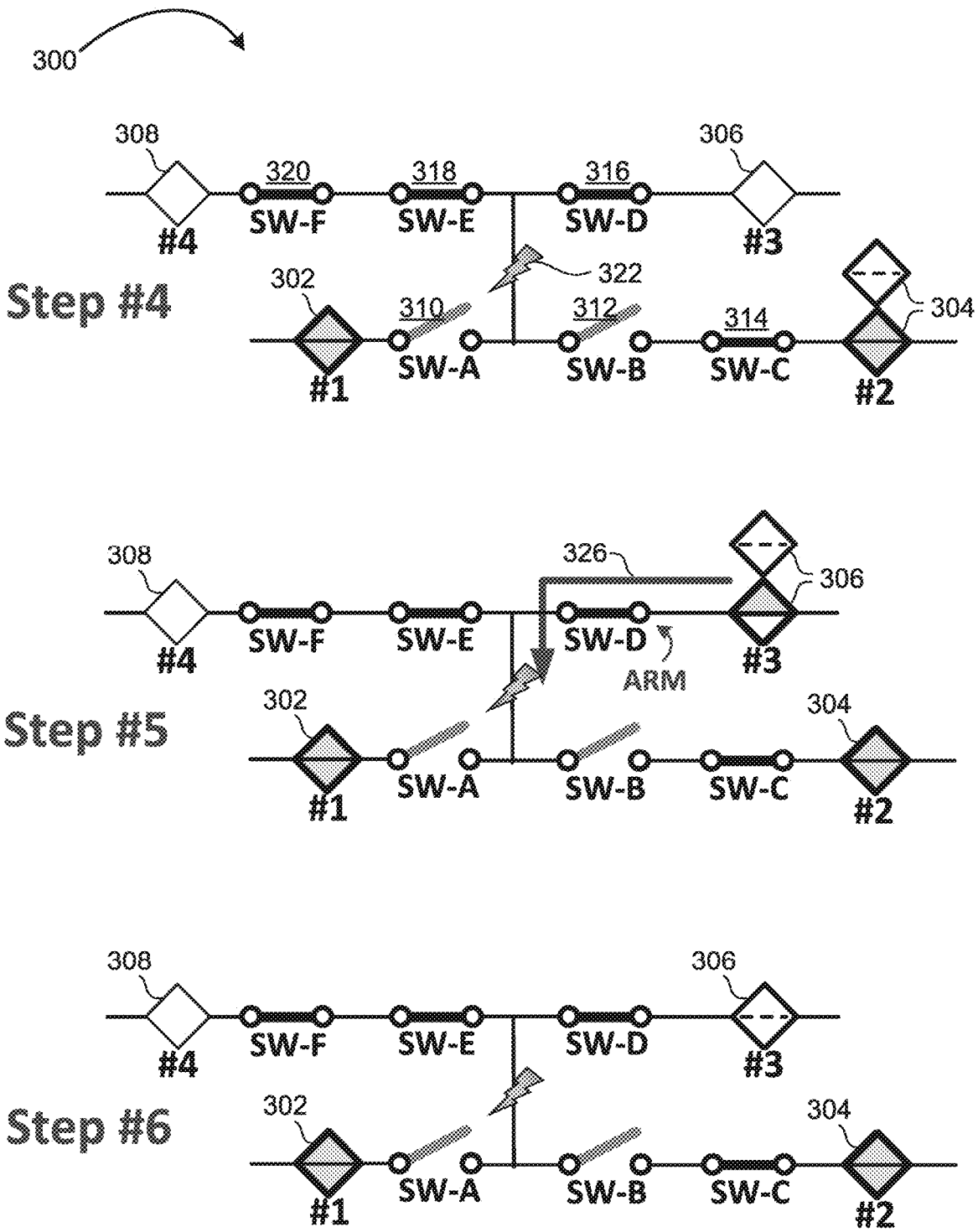
Figure 4C:
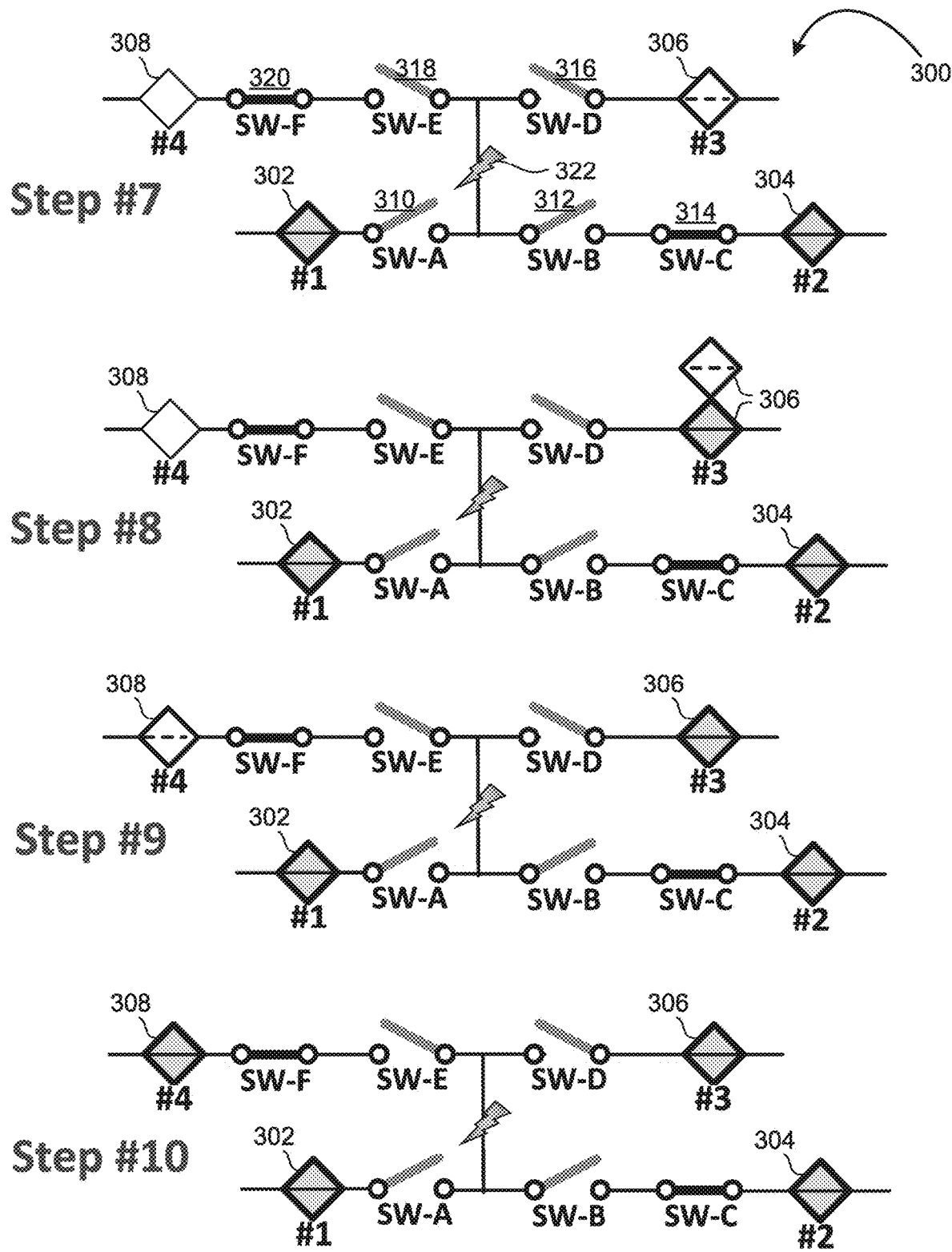

FIGS. 4A, 4B and 4C comprise a multi-step schematic diagram of the feeder 300 illustrating the response of sectionalizing switches to test pulses from interrupter/reclosers, where the interrupter/reclosers use a fast close-open event to arm some switches, according to an embodiment of the present disclosure. FIGS. 4A, 4B and 4C illustrate the same feeder 300 as in FIG. 3, however, the interrupter/reclosers are configured to perform a "Fast Close-Open" operation in order to arm some sectionalizing switches which did not experience the initial high energy fault current. This will be described in detail below as the ten steps of FIG. 4 are discussed.

Step 1 in FIG. 4A is the same as Step 1 in FIG. 3. The interrupter/recloser 302 is the active source to the feeder 300 when the fault 322 occurs and the high energy fault current 324 is detected by the SW-A 310. The high energy fault current detection by the SW-A 310 causes the SW-A 310 to enter an armed state. The remaining steps in FIGS. 4A, 4B and 4C overlap with, but show more detail than, the Steps 2-4 of FIG. 3, and then continue beyond where FIG. 3 ended.

In Step 2 of FIG. 4A, the interrupter/recloser 302 has opened due to the fault 322, and then the interrupter/recloser 302 begins its pulse testing sequence. All of the other interrupter/reclosers remain open. When the interrupter/recloser 302 performs its pulse testing sequence, the SW-A 310 begins accruing fault current pulses because it is armed. The SW-B 312 and SW-C 314 begin accruing load current pulses. The sectionalizing switches on the upper branch of the feeder 300 will not sense any current pulses on the faulted phase because they are downstream of the fault location.

In Step 3 of FIG. 4A, the interrupter/recloser 302 continues its pulse testing sequence until the SW-B 312 opens on load count (LC=2) and the SW-A 310 opens on fault count (FC=3), in the same manner as described with reference to FIG. 3. The interrupter/recloser 302 then recloses, as pulse testing indicates the fault 322 is no longer present since the SW-A 310 has opened.

In Step 4 on FIG. 4B, the interrupter/recloser 302 is closed as just discussed. The interrupter/recloser 304 begins pulse testing, determines that its portion of the circuit is not faulted (because the SW-B 312 is open), and the interrupter/recloser 304 then immediately closes. The interrupter/reclosers 306 and 308 remain open at this stage.

In Step 5 of FIG. 4B, the interrupter/recloser 306 begins pulse testing and detects the fault 322. Rather than continue pulse testing as in FIG. 3 (and have the switches 316, 318 and 320 unable to distinguish between load pulses and fault pulses), at this point the interrupter/recloser 306 performs a fast close-open operation. The fast close-open state is indicated in Step 5 by the heavy outline, solid switch line and fill shading only on the top half of the interrupter/recloser 306. The interrupter/recloser 306 applies the fast close-open procedure on the logic that any previously-open interrupter/recloser that did not trip open on overcurrent, and detects a fault during pulse testing, shall initiate a fast close-open operation to arm downstream switches in the fault path before continuing pulse testing. The fast close-open operation causes a sufficiently large fault current 326 to flow through any switches upstream of the fault (which is the SW-D 316 in this case) which will arm the switch control. The fast close-open is shorter in duration than a full reclosing attempt by a traditional source recloser, because a full reclosing attempt includes measuring current, detecting overcurrent and re-opening in response. In contrast, the fast close-open, according to the present disclosure, is a short duration pre-defined sequence of timed operations which does not involve measuring and reacting to overcurrent.

When the SW-D 316 detects the fault current 326 during the fast close-open of the interrupter/recloser 306, the SW-D 316 enters the armed state in Step 5. In Step 6, immediately after performing the fast close-open, the interrupter/recloser 306 switches back into pulse testing mode, starting the pulse testing logic to isolate the fault. As described previously, now that the interrupter/recloser 306 is the active device (in Steps 5 and 6), the sectionalizing switches which sense the pulses will configure their FC and LC threshold values based on the active device. This means that the SW-D 316 (closest to the active source) will have thresholds of FC=3 and LC=1. The SW-F 320 (furthest from the active source) will have thresholds of FC=1 and LC=3, and the SW-E 318 will have thresholds of FC=2 and LC=2.

In Step 7 (FIG. 4C), when the interrupter/recloser 306 runs its test pulse sequence, the SW-E 318 will open on LC=2, and the SW-D 316 (which is armed and counts only fault current events) will open on FC=3. This activity at Step 7 is analogous to what happened with the SW-A 310 and the SW-B 312 in Step 3. The fast close-open and arming of the SW-D 316 has caused the desired switch opening behavior to occur.

In Step 8, the interrupter/recloser 306 completes its test pulse sequence, doesn't detect the presence of a fault, and recloses. This closing of the interrupter/recloser 306 re-energizes the feeder section between the device 306 and the SW-D 316. In Step 9, the interrupter/recloser 308 begins its test pulse sequence and doesn't detect the presence of a fault because the SW-E 318 is open. The interrupter/recloser 308 then immediately closes as shown in Step 10. It can be seen in Step 10 that the desired result has been achieved; the fault 322 is fully isolated by open sectionalizing switches on all sides, and all unfaulted feeder sections have been re-energized through the closing of all four of the interrupter/reclosers 302, 304, 306 and 308.

To summarize the preceding discussion, the concept of "arming" sectionalizing switches which experience a high energy fault current is introduced to overcome the difficulty in distinguishing between a fault current pulse and a load current pulse during a test pulse sequence. A fast close-open operation is performed by any interrupter/recloser that did not trip open on overcurrent and subsequently detects a fault when pulse testing. The fast close-open serves to arm any switches as necessary in feeder branches other than those proximal to the initially active source (which sensed the initial fault current).

Figure 5:
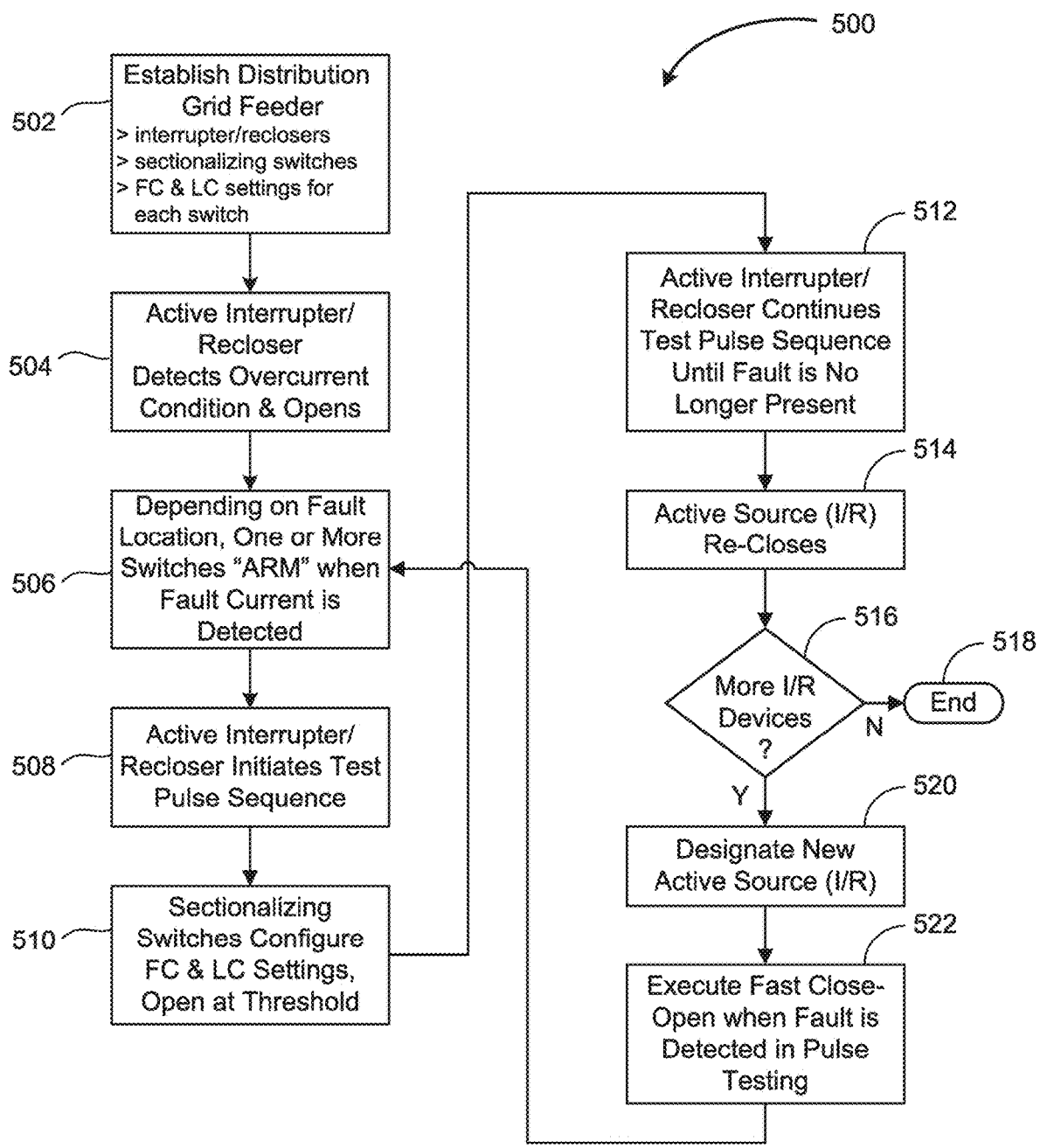
FIG. 5 is a flowchart diagram of a method for isolating a fault using sectionalizing switches, including arming switches in response to an initial fault current and using a fast close-open event to arm switches, according to an embodiment of the present disclosure.

FIG. 5 is a flowchart diagram 500 of a method for isolating a fault in a feeder including sectionalizing switches and bounded by pulse-testing interrupter/reclosers, according to an embodiment of the present disclosure. The method of FIG. 5 incorporates the features described above, including arming switches in response to an initial fault current and using a fast close-open event to arm switches in alternate source branches of the feeder.

At box 502, a distribution grid feeder such as the feeder 300 is established, including a plurality of pulse-testing interrupter/reclosers, one at each end of the feeder (two or more ends, depending on branching), and a plurality of sectionalizing switches spaced apart within the interior of the feeder between the interrupter/reclosers. The sectionalizing switches include current sensors for each phase/pole and a controller, and the interrupter/reclosers include the controller, sensors and switches discussed previously. Establishing the feeder at the box 502 includes providing configuration information to each of the interrupter/reclosers and sectionalizing switches, along with the rules for automatic adjustment of fault count (FC) and load count (LC) thresholds based on the active source. Furthermore, the controller in each of the sectionalizing switches includes the programming logic for "arming" the switch upon detection of a high energy fault current, and thereafter (for a prescribed time duration) counting any test pulse as a fault current pulse.

At box 504, when a fault occurs on at least one phase somewhere within the feeder, the fault is detected by the interrupter/recloser which is the active source to the feeder by sensing a high current, a low voltage, or both, on the faulted phase/pole. When the active interrupter/recloser detects an overcurrent condition created by the fault, the device opens at the box 504, as shown in FIG. 4A, Steps 1 and 2. At box 506, if one or more sectionalizing switches experience the initial high energy fault current, their controls set their state to "armed", as was done by the SW-A 310 in Step 1 of FIGS. 3 and 4. When armed, a sectionalizing switch counts any test pulse as a fault current pulse.

At box 508, the active interrupter/recloser initiates a test pulse sequence to begin isolating the fault by opening of sectionalizing switches. At box 510, the sectionalizing switches in the feeder adaptively configure their fault count (FC) and load count (LC) threshold settings, where configuring the FC and LC thresholds includes determining which interrupter/recloser is the active source and, based on the pre-defined configuration stored in the switch controls device, setting the FC threshold to a highest value for the sectionalizing switch which is closest to the active source and setting the LC threshold to a lowest value for the sectionalizing switch which is closest to the active source, with sectionalizing switches having an FC threshold value one lower for each step further removed from the active source and an LC threshold value one higher for each step further removed from the active source. The adaptive configuration of thresholds at the box 510 is performed as soon as the active source begins pulse testing. The active source can be determined in one of several methods, including each of the interrupter/reclosers having a unique signature of time delays before and between pulses, or the switches determining a direction of power flow in the feeder and inferring the active source based on the direction. At the box 510, the switches open as indicated by their accrued fault counts and/or load counts as the active source continues its pulse testing sequence. This was shown, for example, in FIG. 4A Step 3, where the SW-B 312 opened on LC=2 and the SW-A 310 opened on FC=3.

At box 512, the active source (interrupter/recloser) continues its test pulse sequence and the sectionalizing switches open as appropriate until the opening of a sectionalizing switch causes the active source to be disconnected from the fault, or the maximum number of test pulses is reached. At box 514, after the active source is disconnected from the fault, the source interrupter/recloser recloses. At decision diamond 516, it is determined whether there are other interrupter/reclosers that can be the source of power for the feeder which have not yet tested for fault presence. If no other interrupter/reclosers remain in the feeder, the process ends at terminus 518.

If more interrupter/reclosers remain at the decision diamond 516, then at box 520 a new active source (interrupter/recloser) is designated based on a predefined precedence associated with the feeder topology. At box 522, the new active source (interrupter/recloser) sends an initial test pulse to detect the possible presence of a fault. When a fault is present, the new active source executes a fast close-open operation (Step 5 of FIG. 4B), sending a sufficient fault current through any switches upstream of the fault to result in the switch control being armed. After the fast close-open is executed at the box 522 (or it is determined not to be necessary), the process returns to the box 506 where any switches which experienced a sufficient fault current during the fast close-open go to an armed state, and the new active source initiates its test pulse sequence at the box 508. This was shown in Step 7 of FIG. 4C, where the SW-D 316 (LC=2) and the SW-E 318 (FC=3) opened during pulse testing by the interrupter/recloser 306 after the interrupter/recloser 306 performed a fast close-open.

As will be understood by those skilled in the art, the several and various steps and processes discussed herein to describe the disclosed methods may be referring to operations performed by a computer, a processor or other electronic calculating device that manipulate and/or transform data using electrical phenomenon. In particular, this refers to the control calculations and operations performed by controllers or processors included in each of the sectionalizing switches in the feeders of FIGS. 2-4, and the controller or processor included in the interrupter/reclosers of FIGS. 2-4. Those processors and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The disclosed methods for isolating faults by automated sectionalizing switches equipped with only current sensing when upstream interrupter/reclosers are testing for continued fault presence—by arming switches upon detection of a sufficient fault current, and using a fast close-open when necessary by subsequent interrupter/reclosers—provide a means for reliably implementing FLISR without either voltage sensing capability in the switches or a separate communication system infrastructure and associated hardware in the switches. Using these methods, FLISR implementations are less expensive and more reliable in service restoration, providing significant benefit to electrical power distribution companies and to all consumers on the grid.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for locating and isolating faults in a distribution grid feeder, the feeder including a plurality of sectionalizing switches and being bounded by a plurality of interrupter/reclosers, the method comprising:
providing, to each sectionalizing switch in the feeder, settings based on a feeder topology and rules for establishing a fault pulse count threshold and a load pulse count threshold based on which of the interrupter/reclosers is active;
opening contacts in an active interrupter/recloser to cut off power to the feeder upon detecting conditions on the feeder indicative of a fault in the feeder;
setting an armed state by any of the sectionalizing switches which detect a fault condition, where sectionalizing switches in the armed state count subsequent pulses as fault pulses;
initiating a test pulse sequence by the active interrupter/recloser;
determining which interrupter/recloser is active and adaptively setting the fault pulse count threshold and the load pulse count threshold based on the active interrupter/recloser, by each sectionalizing switch;
continuing the test pulse sequence by the active interrupter/recloser, with each sectionalizing switch opening if it reaches its fault pulse count threshold or its load pulse count threshold, until the fault is isolated from the active interrupter/recloser;
designating a new active interrupter/recloser; and
executing a fast close-open operation by the new active interrupter/recloser when the fault is detected in an initial pulse test.

2. The method according to claim 1 wherein the feeder topology includes identification of the sectionalizing switches and the interrupter/reclosers in the feeder and connectivity therebetween.

3. The method according to claim 1 wherein each of the sectionalizing switches includes current sensors and a controller having a processor and memory, the controller receiving signals from the current sensors and being configured to adaptively set the fault pulse count threshold and the load pulse count threshold and open the sectionalizing switch when one of the thresholds for the switch is reached.

4. The method according to claim 1 wherein each of the interrupter/reclosers includes voltage and current sensors and a controller having a processor and memory, the controller receiving signals from the sensors and being configured to open and close the contacts in the interrupter/recloser, control the test pulse sequence and execute the fast close-open operation.

5. The method according to claim 1 wherein adaptively setting the fault pulse count threshold and the load pulse count threshold based on the active interrupter/recloser by each sectionalizing switch includes setting the fault pulse count threshold for a sectionalizing switch nearest the active interrupter/recloser to a maximum number of test pulses and setting the fault pulse count threshold for each other sectionalizing switch to a value one lower for each place the sectionalizing switch is further removed in the topology from the active interrupter/recloser, and setting the load pulse count threshold for a sectionalizing switch nearest the active interrupter/recloser to one and setting the load pulse count threshold for each other sectionalizing switch to a value one higher for each place the sectionalizing switch is further removed in the topology from the active interrupter/recloser.

6. The method according to claim 1 wherein each sectionalizing switch opening if it reaches its fault pulse count threshold or its load pulse count threshold includes each armed sectionalizing switch counting all test pulses as fault current pulses and each unarmed sectionalizing switch counting all test pulses as load current pulses.

7. The method according to claim 1 wherein the test pulse sequence includes a sequence of low energy pulses provided by the active interrupter/recloser at timed intervals, where the pulses are configured to allow each of the sectionalizing switches to determine if it is located between the active interrupter/recloser and the fault, and to allow the active interrupter/recloser to determine if it is still in electrical contact with the fault.

8. The method according to claim 1 wherein determining which interrupter/recloser is active includes detecting an open interval, where the open interval is an elapsed time from when the active interrupter/recloser cuts off power to the feeder until a first test pulse is sent, and where each of the interrupter/reclosers in the feeder uses a unique value of the open interval.

9. The method according to claim 1 wherein determining which interrupter/recloser is active includes detecting a time interval between pulses on a single phase or between pulses on different phases, and where each of the interrupter/reclosers in the feeder uses a unique value of the time interval between pulses.

10. The method according to claim 1 wherein determining which interrupter/recloser is active includes detecting a power flow direction, where the sectionalizing switches further include voltage sensors, and the power flow direction is determined from an average power computed over a preconfigured time window.

11. The method according to claim 1 wherein the fast close-open operation includes a timed closing and re-opening of the contacts in the active interrupter/recloser designed to cause a recognizable fault current in any of the sectionalizing switches located between the active interrupter/recloser and the fault.

12. The method according to claim 1 further comprising, after executing the fast close-open operation by the new active interrupter/recloser, returning to setting the armed state by any of the sectionalizing switches which detect a fault current, and initiating the test pulse sequence by the new active interrupter/recloser.

13. A fault location, isolation and service restoration system for a distribution grid feeder, the system comprising:
a plurality of interrupter/reclosers each including voltage and current sensors and a controller having a processor and memory, the controller receiving signals from the sensors and being configured to open and close contacts in the interrupter/recloser and command an internal mechanism to create a test pulse sequence, where one interrupter/recloser is located at each branch end of the feeder;
a plurality of sectionalizing switches spaced apart throughout the feeder, where each of the sectionalizing switches includes current sensors and a controller having a processor and memory, the controller receiving signals from the current sensors and being configured to open the sectionalizing switch when a fault pulse count threshold or a load pulse count threshold for the sectionalizing switch is reached, and where the controller is pre-configured with settings based on feeder topology and rules for adaptively setting the thresholds, where an armed state is set by any of the sectionalizing switches which detect a fault current when an interrupter/recloser is closed, and sectionalizing switches in the armed state count subsequent test pulses as fault current pulses, and where any interrupter/recloser which did not trip open based on overcurrent, and which detects the fault upon pulse testing, executes a fast close-open operation before continuing pulse testing.

14. The system according to claim 13 wherein an active interrupter/recloser, when an overcurrent condition created by a fault is detected in the feeder, opens the contacts to cut off power to the feeder and initiates a test pulse sequence.

15. The system according to claim 14 wherein each sectionalizing switch, when power is cut off in response to the fault, determines which interrupter/recloser is active and adaptively sets the thresholds based on the determination of the active interrupter/recloser.

16. The system according to claim 15 wherein the active interrupter/recloser is determined by the sectionalizing switches by evaluating timing of pulse events from the active interrupter/recloser, where each of the interrupter/reclosers in the feeder uses a unique value of the timing of the pulse events.

17. The system according to claim 15 wherein the active interrupter/recloser is determined by the sectionalizing switches by detecting a power flow direction during normal feeder operation, during a fault or during test pulses, where the sectionalizing switches further include voltage sensors, and the power flow direction is determined from an average power computed over a pre-configured sliding time window.

18. The system according to claim 13 wherein the fast close-open operation includes a timed closing and re-opening of the contacts in the active interrupter/recloser designed to cause a recognizable fault current in any of the sectionalizing switches located between the active interrupter/recloser and the fault.

19. The system according to claim 13 wherein the test pulse sequence includes a sequence of low power test pulses provided by an interrupter/recloser at timed intervals, where all of the test pulses are counted as fault current pulses by each armed sectionalizing switch and all of the test pulses are counted as load current pulses by each unarmed sectionalizing switch.

20. The system according to claim 13 wherein, when an active interrupter/recloser completes its test pulse sequence and no longer finds a fault, the active interrupter/recloser re-closes the contacts and a new active interrupter/recloser initiates its test pulse sequence based on a pre-configured time sequence.

* * * * *